(12) United States Patent
Kwon et al.

(10) Patent No.: US 9,245,865 B1
(45) Date of Patent: Jan. 26, 2016

(54) INTEGRATED CIRCUIT PACKAGE WITH MULTI-TRENCH STRUCTURE ON FLIPPED SUBSTRATE CONTACTING UNDERFILL

(71) Applicant: Xilinx, Inc., San Jose, CA (US)

(72) Inventors: Woon-Seong Kwon, Cupertino, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/571,173

(22) Filed: Dec. 15, 2014

(51) Int. Cl.
*H01L 31/12* (2006.01)
*H01L 21/50* (2006.01)
*H01L 23/00* (2006.01)
*H01L 21/56* (2006.01)
*H01L 23/31* (2006.01)
*H01L 23/498* (2006.01)

(52) U.S. Cl.
CPC .............. *H01L 24/17* (2013.01); *H01L 21/563* (2013.01); *H01L 23/3142* (2013.01); *H01L 23/49838* (2013.01); *H01L 24/81* (2013.01); *H01L 2224/12105* (2013.01); *H01L 2224/16227* (2013.01); *H01L 2224/1713* (2013.01); *H01L 2224/17179* (2013.01); *H01L 2224/81801* (2013.01); *H01L 2924/14* (2013.01)

(58) Field of Classification Search
CPC ......... H01L 21/50; H01L 31/12; H01L 23/04; H01L 23/48; H01L 23/52; H01L 29/40; H01L 23/495
USPC ............ 438/25; 257/784, 788, 667, 739, 753, 257/787
See application file for complete search history.

(56) References Cited

U.S. PATENT DOCUMENTS 8,581,396 B2 *  11/2013  Hasebe ............... H01L 23/3107
                                                          257/666
2012/0025209 A1 *  2/2012  Kim ..................... G02B 6/3882
                                                          257/81

* cited by examiner

*Primary Examiner* — Selim Ahmed
(74) *Attorney, Agent, or Firm* — Keith Taboada

(57) ABSTRACT

In an example, an integrated circuit (IC) package includes a package substrate, an IC die, solder bumps, a first plurality of trenches, and underfill material. The IC die includes a front surface and a back surface, the front surface facing the package substrate and including a conductive interface. The solder bumps couple the conductive interface to the package substrate. The first plurality of trenches includes at least one trench proximate each corner of the IC die formed in the front surface of the IC die in an area between the conductive interface and a perimeter of the IC die. The underfill material is disposed between the front surface of the IC die and the package substrate, the underfill material being in contact with the first plurality of trenches.

20 Claims, 4 Drawing Sheets

INTEGRATED CIRCUIT PACKAGE WITH MULTI-TRENCH STRUCTURE ON FLIPPED SUBSTRATE CONTACTING UNDERFILL

TECHNICAL FIELD

Examples of the present disclosure generally relate to integrated circuits (ICs) and, in particular, to an IC package with a multi-trench structure on a flipped substrate contacting underfill.

BACKGROUND

There are a number of conventional processes for packaging integrated circuits (ICs). One approach, which is commonly referred to as "flip-chip" packaging, generally includes forming solder bumps (or other suitable contacts) directly on substrate, such as an IC die or an interposer supporting an IC die. The substrate is then "flipped" and attached to a package substrate. The solder bumps on the flipped substrate are aligned and mounted onto matching contacts on the package substrate. The solder bumps are then reflowed to electrically connect the flipped substrate to the package substrate.

When a flip-chip substrate is mounted to the package substrate, an air gap typically remains between the flipped substrate and package substrate. This gap is commonly filled with material, referred to as underfill, which flows into the gap in liquid form and then solidifies. The underfill material can be a mixture of an epoxy resin and small silica spheres. The underfill material can be applied in liquid form from a dispenser at one edge of the flipped substrate. The underfill then flows into the narrow gap due to capillary action and spreads across the flipped substrate until the gap is filled. The underfill material can be subject to shear and pealing stress, resulting in cracking, delamination, and the like.

SUMMARY

Techniques for providing an IC package with a multi-trench structure on a flipped substrate contacting underfill are described. In an example, an integrated circuit (IC) package includes a package substrate, an IC die, solder bumps, a first plurality of trenches, and underfill material. The IC die includes a front surface and a back surface, the front surface facing the package substrate and including a conductive interface. The solder bumps couple the conductive interface to the package substrate. The first plurality of trenches includes at least one trench proximate each corner of the IC die formed in the front surface of the IC die in an area between the conductive interface and a perimeter of the IC die. The underfill material is disposed between the front surface of the IC die and the package substrate, the underfill material being in contact with the first plurality of trenches.

In another example, an integrated circuit (IC) package includes a package substrate, at least one IC die, an interposer, solder bumps, a first plurality of trenches, and underfill material. The interposer includes a front surface and a back surface, the front surface being facing the package substrate and including a first conductive interface, and the back surface including a second conductive interface to the at least one IC die. The solder bumps couple the first conductive interface to the package substrate. The first plurality of trenches include at least one trench proximate each corner of the interposer formed in the front surface of the interposer in an area between the first conductive interface and a perimeter of the interposer. The underfill material is disposed between the front surface of the interposer and the package substrate, the underfill material being in contact with the first plurality of trenches.

In another example, a method of forming an integrated circuit (IC) package includes: forming a substrate having a front surface and a back surface, the front surface including a conductive interface; forming a first plurality of trenches including at least one trench proximate each corner of the substrate, the first plurality of trenches formed in the front surface of the substrate in an area between the conductive interface and a perimeter of the substrate; mounting the substrate on a package substrate through solder bumps coupling the conductive interface to the package substrate; and depositing underfill material between the front surface of the substrate and the package substrate, the underfill material in contact with the first plurality of trenches.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Techniques for providing an IC package with a multi-trench structure on a substrate contacting underfill are described. The multi-trench structure can reduce stress on the underfill material and prevent underfill failures, such as delamination, cracking, and the like. The multi-trench structure is formed on a surface of a flipped substrate that contacts the underfill material. In an example, the multi-trench structure includes a plurality of trenches formed proximate each corner of the flipped substrate. In another example, the multi-trench structure includes multiple pluralities of trenches formed proximate each corner of the flipped substrate. The multi-trench structure enhances interface fracture toughness by providing more surface area for underfill adhesion. Furthermore, the multi-trench structure changes the mode of the crack-tip phase angle to reduce stress intensity and mitigate underfill delamination. These and further aspects are discussed below with reference to the following figures.

Figure 1:
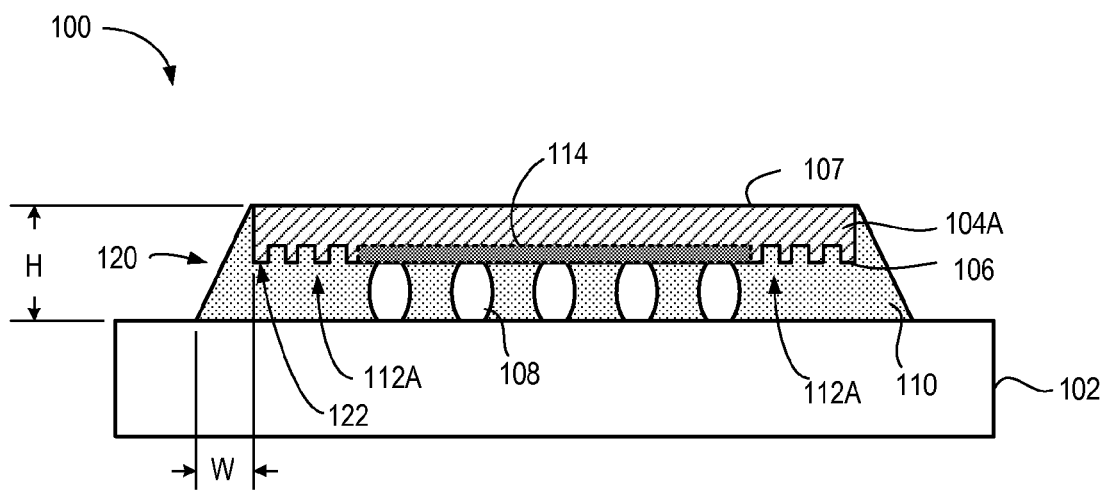
FIG. 1 is a cross-sectional side view showing an example of an integrated circuit (IC) package.

FIG. 1 is a cross-sectional side view showing an example of an integrated circuit (IC) package 100. The IC package 100 includes an IC die 104A mounted to a package substrate 102. The IC die 104A includes a front surface 106 and a back surface 107. The IC die 104A includes a semiconductor substrate comprising silicon, gallium-arsenide, indium-phosphide, or like type semiconductor materials. The IC die 104A includes a plurality of layers formed on the front surface 106, including various conductive and dielectric layers (shown in FIG. 4). The package substrate 102 can include any type of substrate configured to support an IC die, such as any type of organic substrate. The IC die 104A is mounted to the package substrate 102 such that the front surface 106 faces the package substrate 102 (i.e., a flip-chip structure).

The IC die 104A includes a conductive interface 114 on the front surface 106. The conductive interface 114 can be formed using a metal layer of a plurality of metal layers formed on the semiconductor substrate of the IC die. The conductive interface 114 can include, for example, a plurality of bond pads. Solder bumps 108 couple the conductive interface 114, both mechanically and electrically, to the package substrate 102. An underfill material 110 is disposed between the front surface 106 of the IC die 104A and the package substrate 102. Any of various types of underfill material can be used, such as epoxy or epoxy with a filler material.

The underfill material 110 includes a spillover portion 120 that is disposed on the package substrate 102 outside of the region between the IC die 104A and the package substrate 102. The spillover portion 120 includes a width (W) and a height (H). Stress on the IC die 104A from the underfill material 110 increases as the width (W) of the spillover portion 120 increases with respect to the height (H). The stress concentration point is at the edge of the IC die 104A on the front surface 106, as generally shown by crack tip 122. One technique to reduce stress is to reduce the width (W) of the spillover portion 120. Reducing the width (W) of the spillover portion 120 has a limited impact on reducing stress, however, particularly in cases where the height (H) is much smaller than the width (W).

The IC die 104A includes a trench structure 112A formed in the front surface 106. The trench structure 112A includes trenches formed in each corner of the IC die 104A. The trench structure 112A is formed to be in contact with the underfill material 110. The trench structure 112A increases adhesion of the underfill material 110 to the IC die 104A by increasing contact surface area. The trench structure 112A also changes the phase angle of the crack tip 122 from mode I (i.e., opening mode where a tensile stress is normal to the plane of the crack) to mode II (i.e., sliding mode where a shear stress is acting parallel to the plane of the crack and perpendicular to the crack front). Changing the phase angle of the crack tip 122 mitigates delamination of the underfill material 110 from the IC die 104A. The trench structure 112A further reduces the stress intensity factor at the crack tip 122. Thus, the trench structure 112A increases interfacial facture toughness of the IC die-to-underfill interface by improving both underfill adhesion and crack tip phase angle properties. Various example trench structures are described below.

Figure 2:
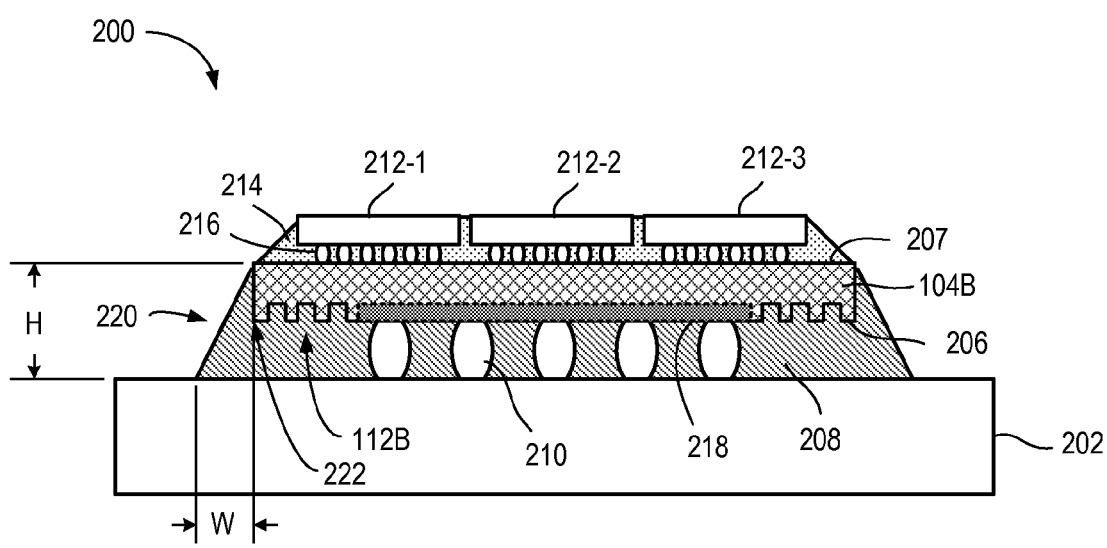
FIG. 2 is a cross-sectional side view showing another example of an integrated circuit IC package.

FIG. 2 is a cross-sectional side view showing another example of an integrated circuit (IC) package 200. The IC package 200 includes an interposer 104B mounted to a package substrate 202. The interposer 104B includes a front surface 206 and a back surface 207. The interposer 104B can include an organic substrate or semiconductor substrate. The package substrate 202 can include any type of substrate configured to support an interposer, such as any type of organic substrate. The interposer 104B is mounted to the package substrate 202 such that the front surface 206 faces the package substrate 202.

The interposer 104B includes a conductive interface 218 on the front surface 206. The conductive interface 218 can be formed using a metal layer of the interposer 104B. The conductive interface 218 can include, for example, a plurality of bond pads. Solder bumps 210 couple the conductive interface 218, both mechanically and electrically, to the package substrate 202. An underfill material 208 is disposed between the front surface 206 of the interposer 104B and the package substrate 202. Any of various types of underfill material can be used, such as epoxy or epoxy with a filler material.

IC die 212-1, 212-2, and 212-3 (collectively IC die 212) are mounted on the back surface 207 of the interposer 104B. While three IC die 212 are shown by way of example, the interposer 104B generally supports at least one IC die. Each of the IC die 212 are coupled to the interposer 104B, both mechanically and electrically, by solder balls 216. An underfill material 214 is disposed between the IC die 212 and the back surface 207 of the interposer 104B.

The underfill material 208 includes a spillover portion 220 that is disposed on the package substrate 202 outside of the region between the interposer 104B and the package substrate 202. The spillover portion 220 includes a width (W) and a height (H). Stress on the interposer 104B from the underfill material 208 increases as the width (W) of the spillover portion 220 increases with respect to the height (H). The stress concentration point is at the edge of the interposer 104B on the front surface 206, as generally shown by crack tip 222. As discussed above, reducing the width (W) of the spillover portion 220 has a limited impact on reducing stress, particularly in cases where the height (H) is much smaller than the width (W).

The interposer 104B includes a trench structure 112B formed in the front surface 206. The trench structure 112B includes trenches formed in each corner of the interposer 104B. The trench structure 112B is formed to be in contact with the underfill material 208. The trench structure 112B increases adhesion of the underfill material 208 to the interposer 104B by increasing contact surface area. The trench structure 112B also changes the phase angle of the crack tip 222 from mode I (i.e., opening mode where a tensile stress is normal to the plane of the crack) to mode II (i.e., sliding mode where a shear stress is acting parallel to the plane of the crack and perpendicular to the crack front). Changing the phase angle of the crack tip 222 mitigates delamination of the underfill material 208 from the interposer 104B. The trench structure 112B further reduces the stress intensity factor at the crack tip 222. Thus, the trench structure 112B increases interfacial facture toughness of the interposer-to-underfill interface by improving both underfill adhesion and crack tip phase angle properties. Various example trench structures are described below.

Figure 3A:
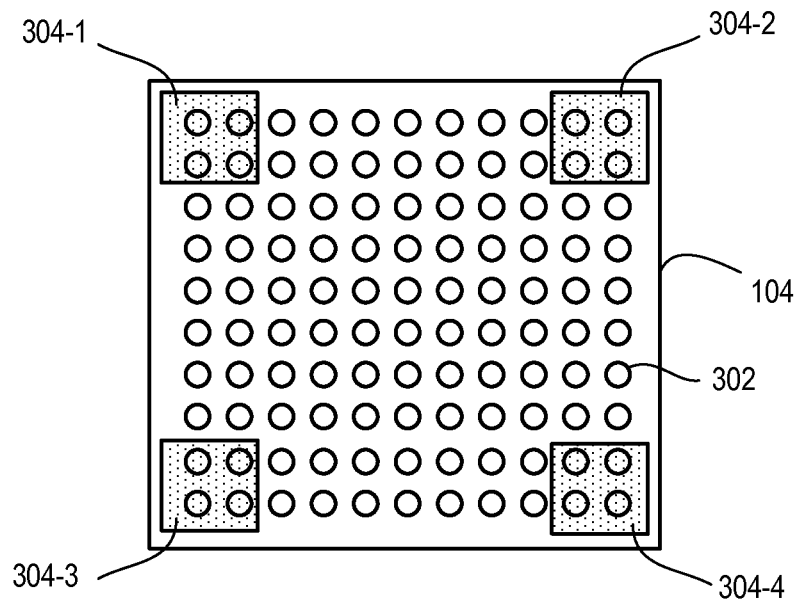
FIG. 3A is a top-down view showing an example of a substrate in an IC package.

FIG. 3A is a top-down view showing an example of a substrate 104 in an IC package. Other parts of the IC package are omitted for clarity. The substrate 104 can be an IC die (e.g., the IC die 104A), an interposer (e.g., the interposer 104B), or other type of substrate in an IC package that interfaces underfill material. The substrate 104 includes solder balls 302 formed on the substrate 104. While the solder balls 302 are shown in rectangular array pattern, the solder balls 302 can be formed on the substrate 104 in any regular or irregular pattern. The substrate 104 includes a trench structure formed in corner regions 304-1, 304-2, 304-3, and 304-4 (collectively corner regions 304). In the example, each of the corner regions 304 includes a portion between the conductive interface (e.g., solder balls 302) and the perimeter of the substrate 104, and a portion within the conductive interface (e.g., between the solder balls 302). In other examples, a given corner region 304 can include only a portion between the conductive interface and the perimeter of the substrate 104, or only a portion within the conductive interface.

Figure 3B:
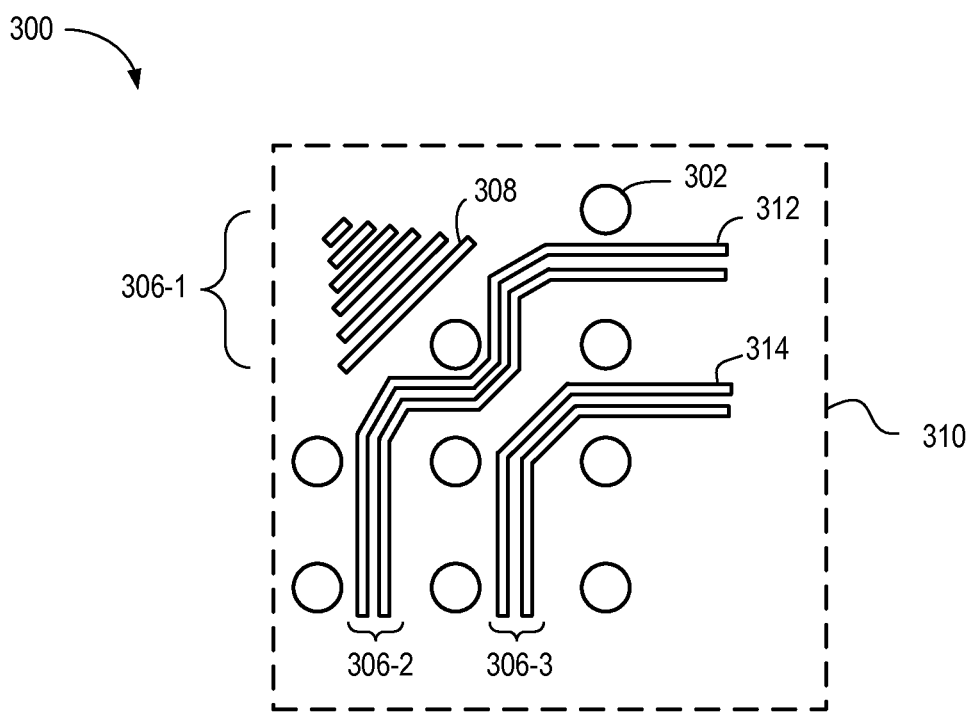
FIG. 3B is a detail view showing an example of a corner portion of a trench structure in a corner region of the substrate of FIG. 3A.

FIG. 3B is a detail view showing an example of a corner portion 300 of a trench structure (e.g., the trench structure 112A or 112B) in a corner region 304 of the substrate 104. The corner portion 300 shown in FIG. 3B can be replicated in each of the corner regions 304 to form the overall trench structure. In the example, the trench structure includes three groups of trenches 306-1, 306-2, and 306-3. The corner portion 300 includes six trenches 308 in the group 306-1, two trenches 312 in the group 306-2, and two trenches 314 in the group 306-3. The trenches 308 of the group 306-1 are formed in a region between the conductive interface (e.g., the solder balls 302) and a perimeter 310 of the substrate 104. The trenches 308 in the group 306-1 are perpendicular to an axis passing through a corner to the substrate 104. The trenches 312 of the group 306-2 are formed within the conductive interface (e.g., between the solder balls 302). Likewise, the trenches 314 of the group 306-3 are formed within the conductive interface (e.g., between the solder balls 302). The trenches 312 of the group 306-2 are generally L-shaped with deviations to compensate for solder balls 302. Likewise, the trenches 314 of the group 306-3 are generally L-shaped with deviations to compensate for solder balls 302. The shapes and orientation of the trenches 308, 312, and 314 shown in FIG. 3B are merely an example, and other shapes and orientations are possible.

The trench structure formed by replicating the corner portion 300 is merely one example. In general, the trench structure includes at least one plurality of trenches, where each plurality of trenches includes at least one trench formed in each corner of the substrate 104. Thus, in another example, the corner portion 300 can include one or more trenches 308 of only the group 306-1. In another example, the corner portion 300 can include one or more trenches 308 of the group 306-1, and one or more trenches 312 of the group 306-2. In another example, the corner portion 300 can include one or more trenches 308 of the group 306-1, one or more trenches 312 of the group 306-2, and one or more trenches of the group 306-3. In another example, the corner portion 300 can include one or more trenches 312 of only the group 306-2. In another example, the trench structure includes four groups of trenches, and thus the corner portion 300 can include additional trench(es) in another group (not shown). These are just a few examples of a given corner portion of a trench structure.

Figure 4:
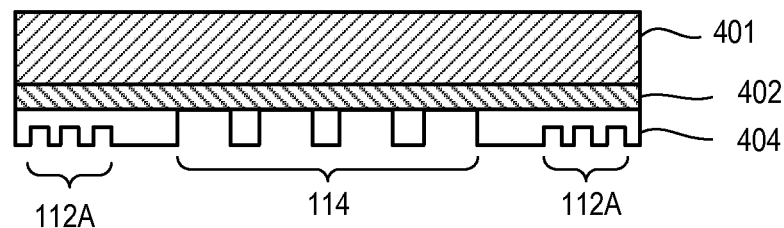
FIG. 4 is a cross-sectional side view showing an example of an IC die.

FIG. 4 is a cross-sectional side view showing an example of the IC die 104A. The IC die 104A includes a semiconductor substrate 401 and a plurality of layers 402 disposed thereon. The plurality of layers 402 can include conductive and dielectric layers as is known in the art. A dielectric layer 404 is formed over the plurality of layers 402 (e.g., a passivation layer). The dielectric layer 404 includes openings to expose the conductive interface 114 (e.g., bond pads formed on a layer of the plurality of layers 402). The dielectric layer 404 also includes trenches formed therein comprising the trench structure 112A. The depth of the trenches can be less than or equal to the thickness of the dielectric layer 404.

Figure 5:
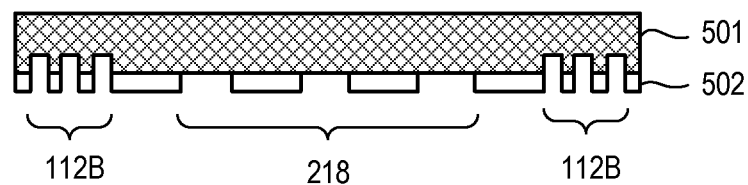
FIG. 5 is a cross-sectional side view showing an example of an interposer.

FIG. 5 is a cross-sectional side view showing an example of the interposer 104B. The interposer 104B includes a substrate 501 and a dielectric layer 502 disposed thereon (e.g., a passivation layer). The dielectric layer 502 includes openings to expose the conductive interface 218 (e.g., bond pads formed on the interposer 104B). Trenches are formed through the dielectric layer 502 and into the substrate 501 to form the trench structure 112B. The depth of the trenches can be greater than the thickness of the dielectric layer 502.

Figure 6:
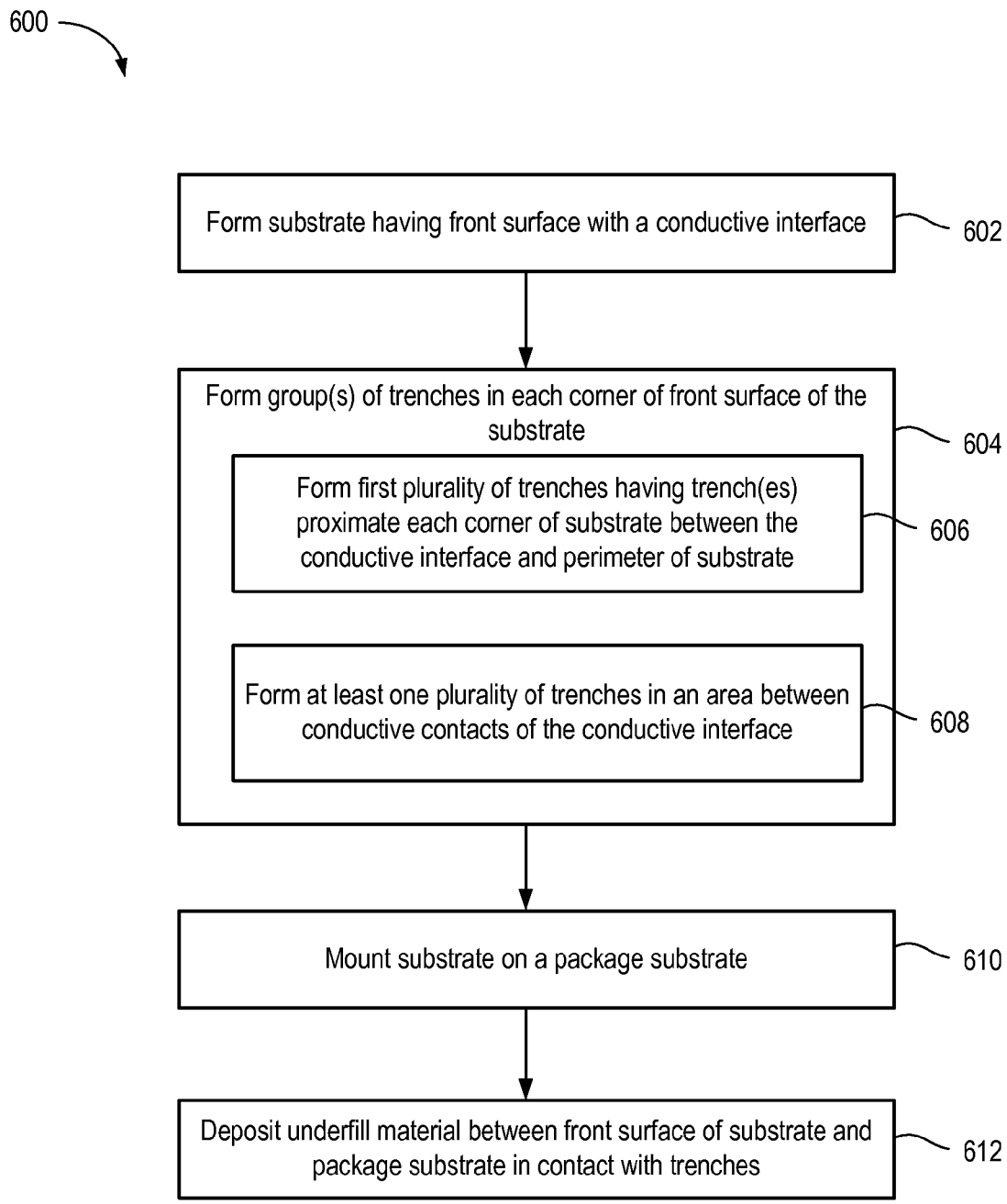
FIG. 6 is a flow diagram showing an example of a method of forming an IC package.

FIG. 6 is a flow diagram showing an example of a method 600 of forming an IC package. The method 600 begins at step 602, where a substrate is formed having a front surface with a conductive interface. For example, the substrate can be the IC die 104A, the interposer 104B, or some other substrate in the IC package. At step 604, at least one group of trenches is formed in each corner of the front surface of the substrate. In an example, at step 606, a first plurality of trenches is formed having at least one trench proximate each corner of the substrate between the conductive interface and the perimeter of the substrate. In another example, at step 608, at least one plurality of trenches is formed each having at least one trench formed in each corner of the substrate within the conductive interconnect. In another example, both steps 606 and 608 are performed (e.g., to produce the corner portion 300 of FIG. 3). At step 610, the substrate is mounted to the package substrate. At step 612, underfill material is deposited between the front surface of the substrate and the package substrate in contact with the trenches.

While the foregoing is directed to specific examples, other and further examples may be devised without departing from the basic scope thereof, and the scope thereof is determined by the claims that follow.

What is claimed is:
1. An integrated circuit (IC) package, comprising:
a package substrate;
an IC die having a front surface and a back surface, the front surface facing the package substrate and including a conductive interface;
solder bumps coupling the conductive interface to the package substrate;
a first plurality of trenches including at least one trench proximate each corner of the IC die, the first plurality of trenches formed in the front surface of the IC die in an area between the conductive interface and a perimeter of the IC die; and
underfill material disposed between the front surface of the IC die and the package substrate, the underfill material in contact with the first plurality of trenches.

2. The IC package of claim 1, wherein, in each corner of the IC die, the respective at least one trench of the first plurality of trenches is perpendicular to an axis in a plane of the front surface that divides an angle formed by the respective corner.

3. The IC package of claim 1, further comprising:
at least one additional plurality of trenches formed in the front surface of the IC die each including at least one trench proximate each corner of the IC die.

4. The IC package of claim 3, wherein each of the at least one additional plurality of trenches is formed in the front surface of the IC die in an area between conductive contacts of the conductive interface.

5. The IC package of claim 4, wherein the at least one trench in each of the at least one additional plurality of trenches includes a first portion parallel to an edge of the IC die and a second portion perpendicular to the edge of the IC die.

6. The IC package of claim 1, wherein front surface includes a dielectric layer formed on a semiconductor substrate of the IC die, and wherein the first plurality of trenches is formed in the dielectric layer.

7. The IC package of claim 1, wherein the front surface includes a dielectric layer formed on a semiconductor substrate of the IC die, and wherein the first plurality of trenches is formed in the dielectric layer and the semiconductor substrate.

8. An integrated circuit (IC) package, comprising:
a package substrate;
at least one IC die;
an interposer having a front surface and a back surface, the front surface facing the package substrate and including a first conductive interface, the back surface including a second conductive interface to the at least one IC die;
solder bumps coupling the first conductive interface to the package substrate;
a first plurality of trenches including at least one trench proximate each corner of the interposer, the first plurality of trenches formed in the front surface of the interposer in an area between the first conductive interface and a perimeter of the interposer; and
underfill material disposed between the front surface of the interposer and the package substrate, the underfill material in contact with the first plurality of trenches.

9. The IC package of claim 8, wherein, in each corner of the interposer, the respective at least one trench of the first plurality of trenches is perpendicular to an axis in a plane of the front surface that divides an angle formed by the respective corner.

10. The IC package of claim 8, further comprising:
at least one additional plurality of trenches formed in the front surface of the interposer each including at least one trench proximate each corner of the interposer.

11. The IC package of claim 10, wherein each of the at least one additional plurality of trenches is formed in the front surface of the interposer in an area between conductive contacts of the conductive interface.

12. The IC package of claim 11, wherein the at least one trench in each of the at least one additional plurality of trenches includes a first portion parallel to an edge of the interposer and a second portion perpendicular to the edge of the interposer.

13. The IC package of claim 8, wherein front surface includes a dielectric layer formed on a substrate of the interposer, and wherein the first plurality of trenches is formed in the dielectric layer.

14. The IC package of claim 8, wherein the front surface includes a dielectric layer formed on a substrate of the interposer, and wherein the first plurality of trenches is formed in the dielectric layer and the substrate.

15. A method of forming an integrated circuit (IC) package, comprising:
forming a substrate having a front surface and a back surface, the front surface including a conductive interface;
forming a first plurality of trenches including at least one trench proximate each corner of the substrate, the first plurality of trenches formed in the front surface of the substrate in an area between the conductive interface and a perimeter of the substrate;
mounting the substrate on a package substrate through solder bumps coupling the conductive interface to the package substrate; and
depositing underfill material between the front surface of the substrate and the package substrate, the underfill material in contact with the first plurality of trenches.

16. The method of claim 15, wherein, in each corner of the substrate, the respective at least one trench of the first plurality of trenches is perpendicular to an axis in a plane of the front surface that divides an angle formed by the respective corner.

17. The method of claim 15, further comprising:
forming at least one additional plurality of trenches in the front surface of the substrate each including at least one trench proximate each corner of the substrate.

18. The method of claim 17, wherein each of the at least one additional plurality of trenches is formed in the front surface of the substrate in an area between conductive contacts of the conductive interface.

19. The method of claim 15, wherein the substrate comprises a semiconductor substrate of an IC die.

20. The method of claim 15, wherein the substrate comprises an interposer coupling at least one IC die to the package substrate.

* * * * *